(12) United States Patent
Hamm et al.

(10) Patent No.: US 6,294,018 B1
(45) Date of Patent: Sep. 25, 2001

(54) ALIGNMENT TECHNIQUES FOR EPITAXIAL GROWTH PROCESSES

(75) Inventors: Robert Alan Hamm, Staten Island, NY (US); Rose Fasano Kopf, Green Brook, NJ (US); Christopher James Pinzone, Basking Ridge, NJ (US); Robert William Ryan, Piscataway, NJ (US); Alaric Tate, Chatham, NJ (US)

(73) Assignee: Lucent Technologies, Murray Hill, NJ (US)

( * ) Notice: Subject to any disclaimer, the term of this patent is extended or adjusted under 35 U.S.C. 154(b) by 0 days.

(21) Appl. No.: 09/396,035

(22) Filed: Sep. 15, 1999

(51) Int. Cl.[7] .................................................. C30B 25/04
(52) U.S. Cl. ................. 117/90; 117/94; 117/95; 117/96; 117/954; 117/955
(58) Field of Search .................... 117/90, 94, 95, 117/96, 954, 955

(56) References Cited

U.S. PATENT DOCUMENTS

| | | | |
|---|---|---|---|
| 4,507,845 | * | 4/1985 | McIver et al. .......................... 29/571 |
| 4,893,163 | * | 1/1990 | Rudeck ................................... 357/40 |
| 4,992,394 | * | 2/1991 | Kostelak et al. ...................... 437/229 |
| 5,001,076 | * | 3/1991 | Mikkelson .............................. 437/40 |
| 5,243,207 | * | 9/1993 | Plumton et al. ...................... 257/192 |

OTHER PUBLICATIONS

Yamamoto et al., "Novel Alignment Method for Planarized Substrates in Electron Beam Lithography", Japanese Journal of Applied Physics, vol. 58 pp. 7040–7045, Dec. 1999.*

* cited by examiner

Primary Examiner—Robert Kunemund
(74) Attorney, Agent, or Firm—Peter V. D. Wilde; Thomas, Kayden, Horstemeyer & Risley LLP

(57) ABSTRACT

The specification describes a lithographic technique in which alignment marks are defined in a first semiconductor layer and the alignment marks are then covered with a protective $SiO_2$ layer. After subsequent semiconductor layer growth steps, which selectively deposit on the former semiconductor layer but not on the protective layer, the alignment marks remain undistorted and visible to the exposure tool for subsequent processing.

11 Claims, 6 Drawing Sheets

ALIGNMENT TECHNIQUES FOR EPITAXIAL GROWTH PROCESSES

FIELD OF THE INVENTION

This invention relates to lithography techniques used in the manufacture of electronic and photonic integrated circuits.

BACKGROUND OF THE INVENTION

In state of the art semiconductor device processing, lithography is a key technology in fabricating wafers with large numbers of chip sites. Although x-ray and electron beam lithography tools are useful and effective, especially for mask making, photolithography remains the most widely used lithography tool for semiconductor wafer fabrication. Likewise, although a variety of exposure tools have been developed over the years, step and repeat cameras are ubiquitous in commercial integrated circuit manufacture. These tools, usually referred to as steppers, rely for their effectiveness on the ability to register photomasks in exact alignment from level to level. Typical state of the art wafer fabrication processes have several levels or layers where photomasks are employed in conjunction with standard process steps to define features in the device substrate or on the layers. In the usual process, alignment marks are formed at the first processing level to provide means for registering the photomask for the subsequent photolithography steps. The marks usually consist of a pattern of marks formed by photolithograpic masking and either etching or lift-off. The pattern of marks remain throughout the process.

Photolithographic patterns are typically made by spinning a uniform coating of photoresist over the entire wafer, exposing the photoresist with actinic light directed through a photomask, and developing the photoresist to leave a photoresist pattern.

In this description, the term photomask refers to the master mask or reticle that defines the pattern of actinic radiation incident on the photoresist. The term lithographic mask refers to the patterned photoresist which is used to define the regions where processing activity, e.g. etching, metal deposition, occurs in the layer masked by the photoresist. Each photomask, and the photoresist pattern produced therefrom, typically has imbedded therein a series of alignment marks, which are key ingredients in multilevel wafer fabrication. For example, if the first photoresist pattern is used to mask an oxide layer, silicon layer, or a metal layer for an etch step, the alignment marks will be transferred to the layer as an etched pattern. In this way when each sequential layer is deposited and patterned, the alignment marks from the first layer can be used to register all succeeding photomasks. Thus the desired topography can be constructed with great precision in the x-y planes. In projection lithography systems, the alignment itself is usually performed with automated tools. State of the art steppers have vision systems that easily identify the alignment marks on the wafer and automatically register the next photomask with the alignment marks previously formed, provided that the integrity of the alignment marks is maintained during the process.

The initial alignment mark pattern is frequently made in a metal layer formed at the edge of the wafer for alignment purposes. However, in some processes, notably in III-V semiconductor stack processes, the III-V semiconductor processing is inconsistent with the presence of metal alignment marks. In such cases, it is necessary or desirable to form alignment marks in the semiconductor layers themselves. One such general case is one wherein a feature is defined early in the process, and growth (or regrowth) of other layers follows the patterning of that feature. In this situation, alignment marks formed in the semiconductor layer in conjunction with the first patterning step are covered by at least one later epitaxially grown layer. As a consequence, the marks may be partially or fully obliterated or severely distorted during the growth steps. This is especially likely in processes that use multiple growth or regrowth steps.

Multiple regrowth of epitaxial layers is advantageously used in the manufacture of heterostructure bipolar transistors (HBTs). HBTs are important for optoelectronic integrated circuits, digital ICs, and microwave/millimeter wave low phase-noise oscillators. See D. Caffin et al., Electronics Letters 33, p. 149 (1997); Stanaka et al., Electronics Letters 26, p. 1439 (1990). InGaAs/InP HBTs are of increasing importance since these devices offer the advantages, over GaAs/AlGaAs HBTs, of a lower turn-on voltage, higher electron mobility, better thermal dissipation, and better microwave performance. See D. Caffin et al., IEEE TRansactions on Electron Devices, 44, p. 930 (1997); S. Yamahata et al., IEEE GaAs IC Symposium, p. 345 (1994). An optimum double heterostructure bipolar transistor (DHBT) layer structure can be employed to take advantage of these superior material properties. To increase the bandwidth of the device, the dimensions of the device should be scaled down. See B. Agarwal et al., IEDM, p. 743 (1997). Vertical scaling increases the unity current gain cutoff frequency, $f_t$, of the device since $f_t$ scales as $1/(2\pi t_{eff})$, where the effective transit time, $t_{eff}$, is dominated by the base-collector transit time, $t_b$. On the other hand, lateral device scaling is required to improve the maximum available power gain, $f_{max}$, of the device, since it scales as $(f_t/8\pi R_b C_{bc})^{1/2}$, where $R_b$ is the base resistance and $C_{bc}$ is the base-collector capacitance. Defining the subcollector prior to growing the active HBT stack offers the advantage of lateral scaling.

Several techniques have been developed to reduce parasitics, such as $C_{bc}$. They include improvements in device processing, as well as epitaxial regrowth. One processing technique, for example, uses implant isolation under the base contact for lateral scaling of GaAs-based HBTs. See M-C Ho et al., IEEE Electron Device Lett. 16 (11), p. 512 (1995); M. Yanagihara et al., Solid-State Electronics 41 (10), p. 1615 (1997); P. Asbeck, Solid-State Electronics 38 (9), p. 1691 (1995). This results in a highly resistive layer under the external base of the structure, which reduces $C_{bc}$. Implant isolation may also be used for device isolation in the GaAs material system. See F. Ren et al., Solid-State Electronics 38 (9), p. 1635 (1995). However, InP/InGaAs devices cannot be isolated this way since implantation does not produce sufficient resistivity in this system for isolation. Other techniques to reduce $C_{bc}$ have also been developed, including planarization with nitride or polyimide, polycrystal isolation using $SiO_2$, micro-airbridge isolation, and selective undercut of the collector. See B. Willen et al., Electronic Letters 33 (8), p. 719 (1997); H. Shin et al., IEEE Electron Device Lett. 19 (8), p. 297 (1998); K. Mochizuki et al., IEEE Electron Device Lett. 19 (2), p. 47 (1998); T. Oka et al., IEEE Electron Device Lett. 18 (4), p. 154 (1997); S. Tadayon et al., Electronics Letters 29, p. 26 (1993); W. L. Chen et al., IEEE Electron Device Lett. 18 (7), p. 355 (1997); R.F. Kopf et al., Solid-State Electronics 42 (12), p. 2239 (1998). These techniques require fabricating devices using mesa isolation and reducing lateral confinement of the collector region by selectively undercutting this region and either back-filling the gap with dielectric material or leaving it open to air.

Since these InP/InGaAs HBTs are fabricated using a double mesa structure, the base-collector junction area is substantially larger than the emitter area to accommodate the base electrode pad. Unfortunately, the collector region may only be undercut a small amount, on the order of 1 to 2 μm and also maintain good device characteristics and reliability. For example, the mesa structure may is crack off or collapse, and create base-collector shorts, if it is undercut too much. To avoid problems with extensive mesa undercutting, while also reducing $C_{bc}$ further, a transferred substrate technique has been developed. See B. Agarwal et al., IEDM, p. 743 (1997). This may also be termed active packaging, where certain fabrication steps are performed after the partially processed device is packaged or transferred onto a host platform. See Luryi et al., IEEE Transactions on Electron Devices 41 (12), p. 2241 (1994). This technique is a flip-chip process with narrow and aligned emitter and collector stripes on opposite sides of the base epitaxial layer. With this technique, a very high $f_{max}$ has been obtained. This technique requires some complex processing, such as lithography, etching, and metallization, on opposite sides of the epitaxial base layer.

Multistep epitaxial regrowth offers some advantages over the above processing techniques since the final processing does not involve any extensive undercutting or flip-chip processing. Several growth techniques, including molecular beam epitaxy (MBE), gas-source molecular beam epitaxy (GSMBE), metal-organic chemical vapor deposition (MOCVD), and metal-organic molecular beam epitaxy (MOMBE) have been used for optimization of specific layers. For details on these techniques see M. Micovic et al., J. Vac. Sci. Technol. B16 (3), p. 962 (1998), D.L. Plumton et al., Electronic Letters 25 (18), p. 1212 (1989), S.H. Park et al., IEEE Electron Device Lett. 19 (7), p. 118 (1998), D. Zerguine et al., Electronic Letters 29 (15), p. 1349 (1997), F. Alexandre et al., J. Crystal Growth 136, p. 235 (1994), H. Dodo et al, IEEE Electron Device Lett. 19 (4), p. 121 (1998), Y. M. Hsin et al., J. Crystal Growth 188, p. 355 (1998), T. Nomura et al., IEDM, p. 747 (1997), Y-F Yang et al., IEEE Electron Device Lett. 17 (11), p. 531 (1996), and J-H Son et al., Jpn. J. Appl. Phys. 34, p. 1085 (1995). These papers are incorporated herein by references for any essential details of the processing used in the invention. Devices can be fabricated with multi-step regrowth with a minimum overlap of the extrinsic base and subcollector region to reduce $C_{bc}$. These regrowth techniques have also been used for the regrowth of the $p^+$ base contacts to reduce $R_b$, which, in turn, reduces thermal and shot noise. The techniques used for regrowth each have their advantages. MOMBE, for example, offers the advantage of high doping levels of $3 \times 10^{19}$ cm$^{-3}$ for Sn, and $7 \times 10^{19}$ cm$^{-3}$ for C. This technique is also applicable for the growth of InGaAsP quaternary layers, lattice-matched to InP, to grade out the band gap discontinuity at the heterojunctions. MOCVD, on the other hand, offers the advantage of better planarization and step coverage, since the growth temperature and chamber pressure are higher, the reactant species can migrate long distances. MOCVD, MOMBE, and chemical beam epitaxy (CBE) growth techniques allow for selective area growth, since, for epitaxial growth, they require pyrolysis of the source material on the surface.

One problem with the regrowth technique is the production and protection of alignment marks to be used during patterning of the various layers in the base-emitter stack. Since growth occurs on the entire wafer, and the lateral growth rate is dependent on the crystallographic direction, any initial alignment marks formed e.g. at the sub-collector level become distorted during later growth and processing. To date, these structures have been made using contact alignment. However, this gives registration capability of 1 micron or more. Dense devices arrays and state of the art OICs require better alignment tolerances.

SUMMARY OF THE INVENTION

We have developed a process for making multi-layer structures, such as HBTs, wherein alignment marks formed at an early stage in the process, i.e. before regrowth of the multi-layer stack occurs, are preserved through the regrowth steps by masking the alignment marks in a manner that allows selective area regrowth and leaves the alignment marks uncovered. This allows a standard stepper alignment system to read the initial marks through all of the processing stages. Alignment registration of +/−0.125 μm is easily achieved, compared with one micron alignment obtained using contact alignment.

DETAILED DESCRIPTION

The novel approach to alignment features according to the invention will be described in the context of a process for the fabrication of III-V HBT devices. However, it will be appreciated by those skilled in the art that the formation and protection of alignment marks in a multi-layer regrowth process may find other applications in semiconductor device fabrication, and especially in III-V multi-layer heterostructure devices, e.g. lasers, modulators, etc.

Figure 1:
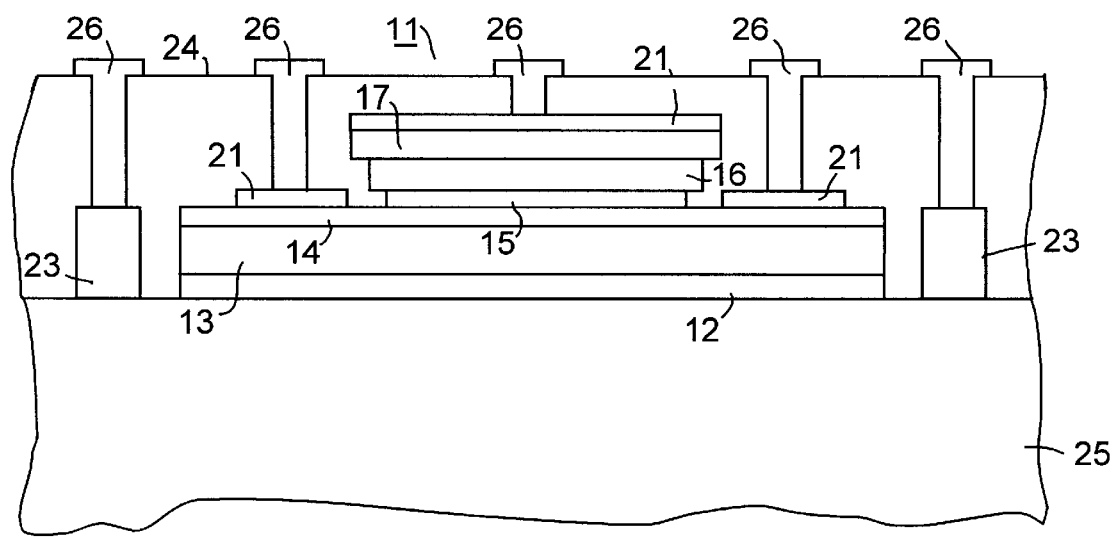
FIG. 1 is a schematic diagram of an HBT device fabricated using the technique of the invention.

Referring to FIG. 1, a completed HBT device 11 of the kind for which the process of the invention is particularly intended is shown. The device has a multi-layer semiconductor heterostructure stack which is shown here with seven semiconductor layers 12–18. The multi-layer stack may be grown by Meta Organic Molecular Beam Epitaxy (MOMBE) using standard growth techniques known in the art. A general description of the MOMBE process can be found in M. B. Panish and H. Temkin, "Gas Source Molecular Beam Epitaxy", Chapter 4, Springer Series in Materials Science, Vol 26, Springer-Verlag 1993, which is incorporated herein by reference for details of the process. The MBE growth technique is ideal for making heterostructures because very complex multi-layer stacks can be produced on a substrate wafer in a series of sequential growth steps in a vacuum apparatus without breaking the vacuum and handling the wafer. Thus all of the layers in the stack are completed before the device fabrication sequence begins.

Referring to FIG. 1, the substrate layer 25 is semi-insulating (100) InP on which the series of semiconductor layers 12–18 are sequentially grown. Some of these layers comprise a sub-series of graded layers as will be described. However, for clarity and simplicity in the description only the seven functional layers are shown. In the context of processing the multi-layer stack, the layers that comprise graded sub-layers are processed as if they were a single layer.

The first grown layer 12 is typically 2000–5000 Angstrom $In_{0.53}Ga_{0.47}As$ subcollector layer doped $n^+$ with a dopant concentration of $3 \times 10^{19}$ cm$^{-3}$. The n-type dopant used in this process was Sn, although other n-type impurities such as Si can be used. The subcollector layer 12 may also include buffer layers to prevent up diffusion of impurities in the multi-layer structure. The buffer layers may comprise a 200 Å $In_{0.53}Ga_{0.47}As$, n-doped at a level of $1\times10^{18}$ cm$^{-3}$, and a 20 Å undoped $In_{0.53}Ga_{0.47}As$ layer.

The sub-collector layer is then patterned to reduce its size, and reduce the potential for excessive overlap between the base and sub-collector. The layer is patterned by known techniques to leave a layer approximately 3×3 $\mu m^2$. The remainder of the multi-layer stack is regrown over the patterned sub-collector.

At the sub-collector stage of the process, according to the invention, the alignment marks are formed in the sub-collector layer using the same patterning operation used to form the subcollector. Alignment marks are typically formed at the edge of the wafer and do not appear in FIG. 1. The marks themselves are conventional, typically an array of approximately 4 $\mu m$ squares.

The alignment marks are then covered with a protective layer of $SiO_2$. This layer is deposited over the patterned sub-collector by plasma enhanced chemical vapor deposition (PECVD) or other suitable technique. The $SiO_2$ layer is then patterned by conventional means to leave a protective strip of the $SiO_2$ over the alignment marks. The regrowth of subsequent layers in the semiconductor stack occurs selectively, with no growth occurring on the alignment mark array.

With reference again to FIG. 1, collector layer 13 is a 4000 Å layer of n-InP with an impurity concentration of $3\times10^{16}$ cm$^{-3}$. The base layer 14 is 500 Å of p$^+$ $In_{0.53}Ga_{0.47}As$ doped to a concentration of $3\times10^{19}$ cm$^{-3}$ with carbon. The emitter layer 15 is 1000 Å of InP n-doped to a concentration of $5\times10^{17}$ cm$^{-3}$ with Sn. The top semiconductor layer 16 is a contact layer consisting of 2000 Å of $In_{0.53}Ga_{0.47}As$ doped n-type with a concentration of $3\times10^{19}$ cm$^{-3}$. In some heterostructure devices, both the emitter-base and collector-base regions are graded.

A metal contact 17 is selectively applied to the top semiconductor contact layer 16 by a lift-off technique. The metal contact 17 may be Pd/Pt/Au, and during fabrication serves as an etch mask in a self-aligning mode. The top semiconductor contact layer 16 is etched using the metal contact layer 17 as an etch mask. A wet etchant is used. An overetch is performed to obtain an undercut under the metal contact. This patterned contact 16 then may serves as the etch mask for the emitter layer 15. The InP emitter layer is then wet etched. The base contact 21 is applied using the metal contact 17 as a shadow mask to define the inner edge of the base contact. The base contact layer also deposits on the emitter contact 17 as shown. Metallization for layer 21 may be deposited using a lift-off process, which defines the outer edges of the base contacts. The structure is then encapsulated and the encapsulant patterned to define the base-collector mesa. The exposed portions of base layer 14 and collector layer 13, are sequentially etched. As a consequence of using the alignment marks of the invention the edges of the base 14 and the subcollector 12 are aligned with high precision.

The collector contacts 23 are then formed, and the finished mesa structure is passivated and encapsulated with a common layer 24, i.e. a polymer encapsulant.

The device structure is completed by etching via holes through encapsulant layer 24 to the collector, base and emitter metallization respectively, and evaporating metal contacts 26 into the via holes as shown.

The process sequence is illustrated in FIGS. 2–15. The alignment marks that are a central focus of the invention are formed at the edge of the field. For the purpose of illustrating the process sequence the edge of the field, with the alignment marks, are shown in these figures.

Figure 2:
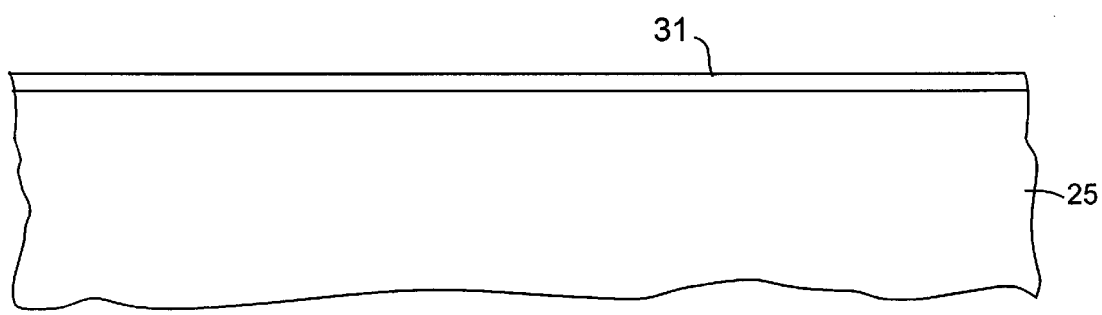
FIGS. 2–15 are schematic views representing steps using the alignment marks of the invention as applied to the device of FIG. 1.
Figure 3:
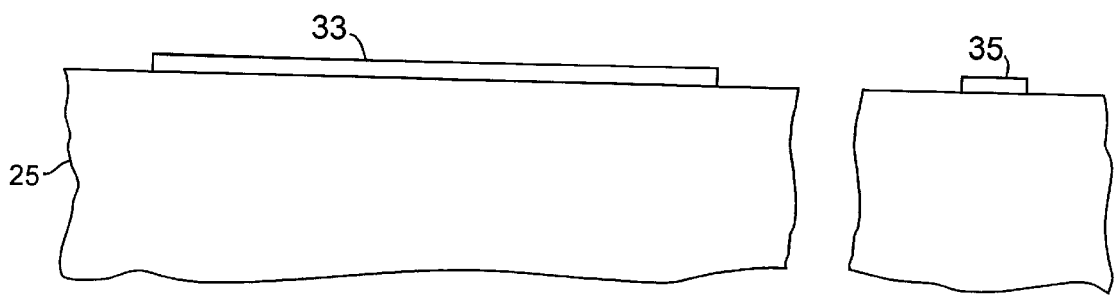
Figure 4:
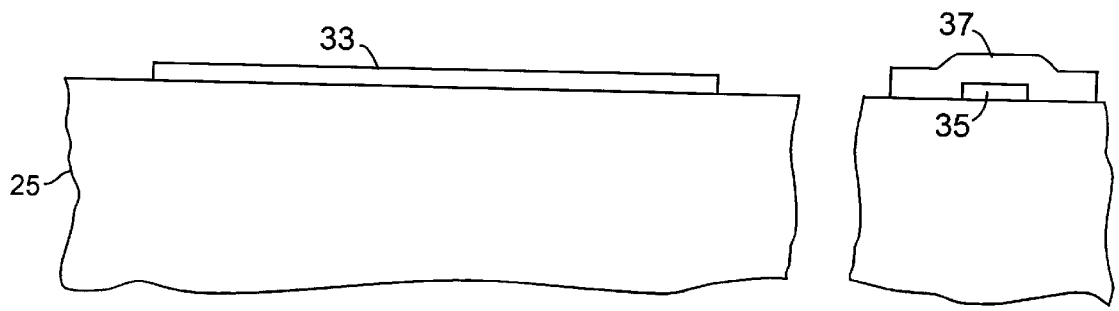

FIG. 2 represents the step of depositing the sub-collector layer 31 by MBE. This layer is then masked by conventional lithography and both the sub-collector and the alignment marks are formed in layer 31. With reference to FIG. 3, the sub-collector 33 and the alignment marks 35 are shown after patterning. For simplicity, a single alignment mark 35 is shown which represents the alignment mark array mentioned above.

Next, the protective oxide layer is blanket deposited over the structure and patterned by conventional lithography and etching to form a protective stripe 37 over the alignment marks 35. The thickness of the protective oxide can vary substantially, e.g. a range of 1000–5000 Å is suitable. The $SiO_2$ may be deposited by PECVD using 20W rf (13.86 MHz) at 300° C. and 650 mTorr, 710 sccm $N_2O$ and 200 sccm 2%$SiH_4/N_2$. The oxide was patterned by etching in BOE (7:1) for 2 min. The wafer was then cleaned in a parallel plate etcher with an $O^2$ plasma at 50 W and 250 mTorr for 1 min. Then the wafer was etched for 15 s in a bromine/water solution consisting of 40 ml 1%$Br/H_2O$+20 ml conc. $H_3PO_4$+300 ml $H_2O$. Alternative materials may be used for the protective stripe, e.g. $Si_3N_x$, TaO. The material should be sufficiently refractory to withstand the growth temperatures.

Figure 5:
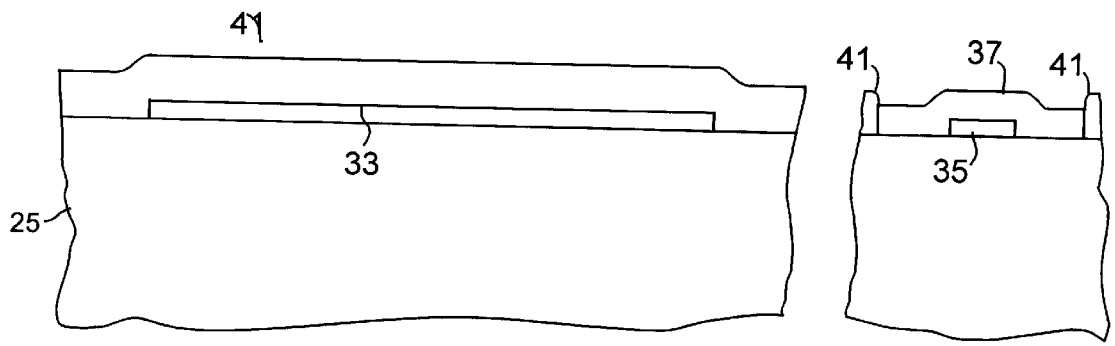

The multilayer stack is then grown on the substrate by a suitable technique such as MOCVD at a temperature of 650° C., a pressure of 80 mbar, and a growth rate of 16 Å/sec. The first layer 41 is the collector layer and is shown after growth in FIG. 5. The layer selectively grows on the semiconductor substrate 25 and on the sub-collector 33, but the III-V precursor materials do not nucleate on the $SiO_2$ protective stripe 37 and no growth occurs there. In FIG. 5, growth is shown at 41 at the edge of the protective stripe, but not on it.

Figure 6:
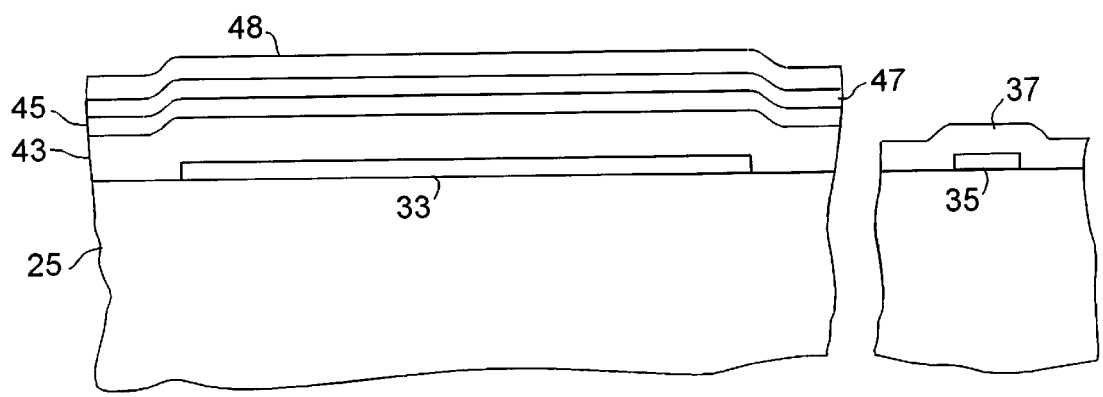
Figure 7:
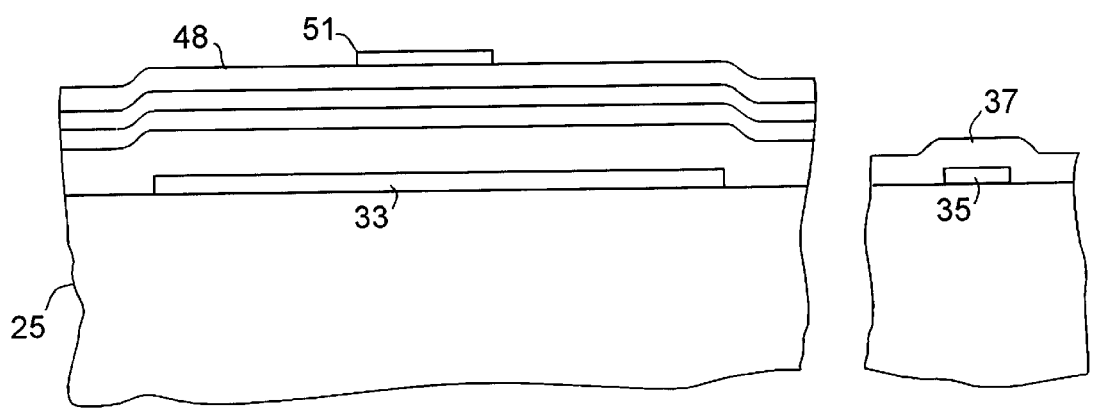

With reference to FIG. 6 the remainder of the multi-layers are grown, using MOMBE, with similar results, i.e. no growth occurs over the alignment marks 35 due to the protective stripe 37. For clarity in this description only the InP collector layer 43, the p+InGaAs base layer 45, the InP emitter layer 47, and the n+InGaAs emitter contact layer 48 are shown. The reactant gases used for either MOCVD or MOMBE were trimethylindium, triethylgallium, phosphine, arsine, elemental Sn, and $CBr_4$. Buffer layers etc. that may used in these structures are not shown. The multi-layer semiconductor stack can be grown using any suitable combination of MOCVD and MOMBE, or either technique alone.

Figure 8:
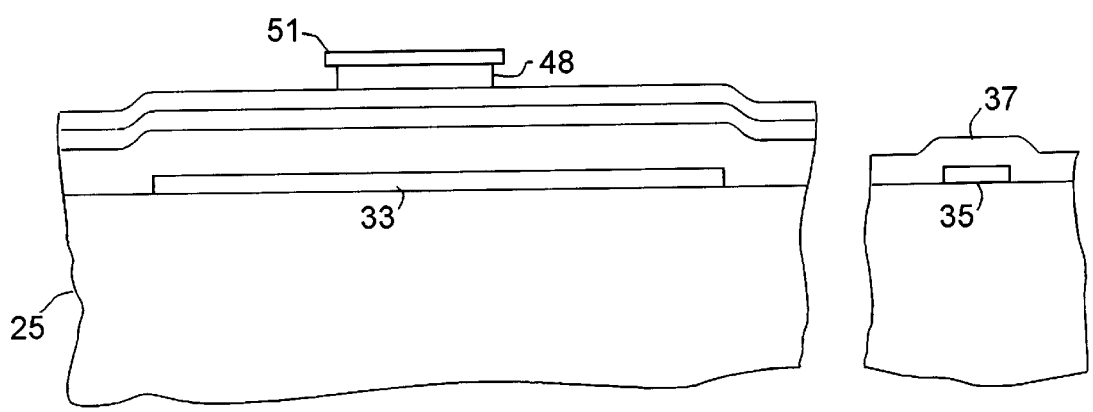
Figure 9:
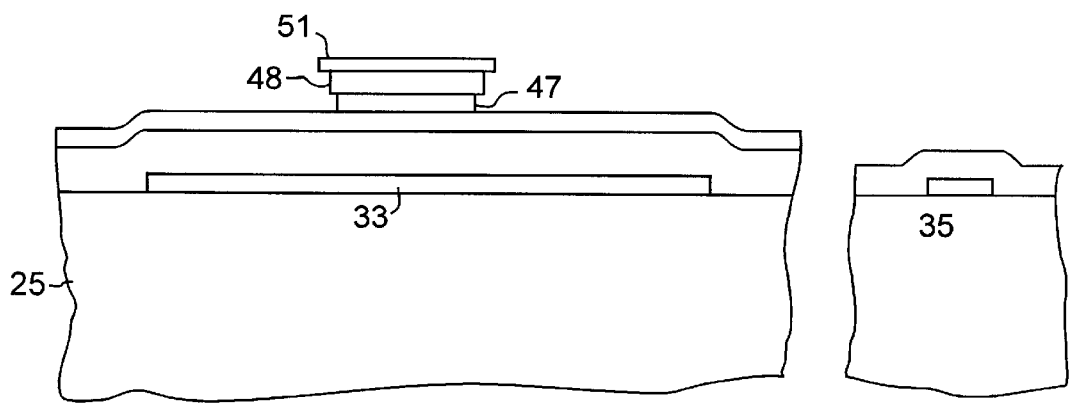
Figure 10:
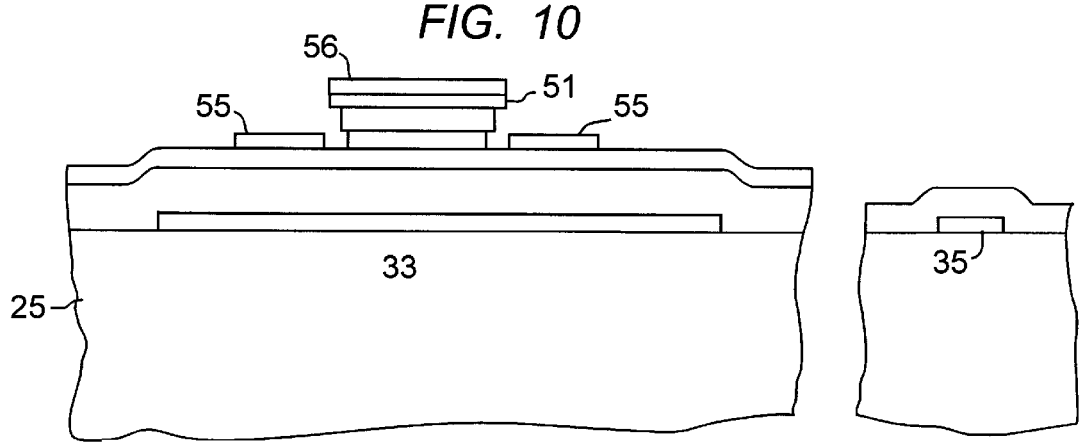

The multi-layer stack is then processed to produce the HBT device. A suitable sequence begins with FIG. 7. A metal contact 51 is selectively applied to the semiconductor contact layer 48 by a lift-off technique. The metal contact 51 serves as an etch mask during fabrication in a self-aligning mode. The contact 51 is centered with respect to the sub-collector 33 using the alignment marks 35 for aligning the etch mask used to define contact 51. The emitter contact layer 48 is then etched as shown in FIG. 8 using the metal contact 51 as an etch mask. A wet etchant is used. An overetch may be performed to obtain an undercut under the metal contact. This patterned contact 48, which is precisely aligned with the subcollector using the protected alignment marks as just described, then serves as the etch mask for the emitter layer 47 as shown in FIG. 9. This results in the emitter also being precisely aligned to the sub-collector. The InP emitter layer may be wet etched. With reference to FIG. 10, the base contact 55 is applied by evaporating the base contact metal using the metal contact 51 as a shadow mask to define the inner edge of the base contact. In this step the emitter contact 51 is also coated with additional metal 56.

Figure 11:
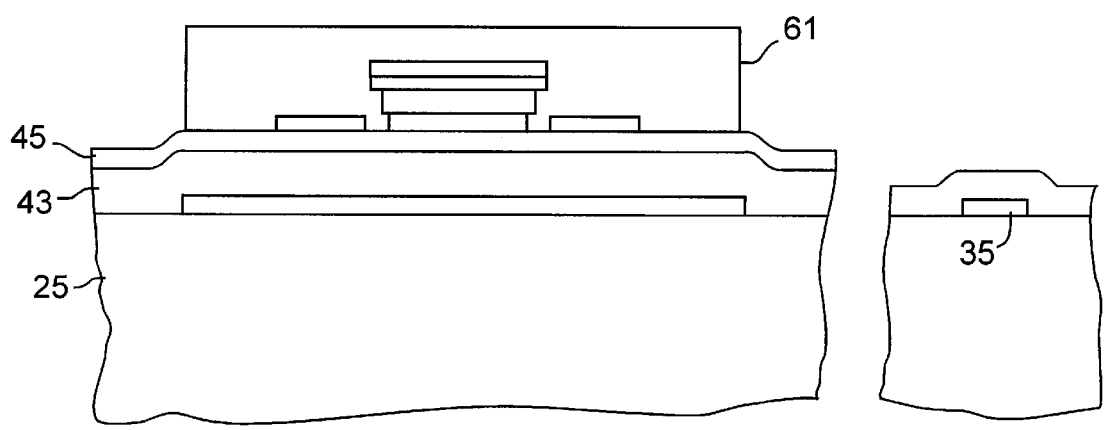

The structure is then encapsulated and the encapsulant 61 patterned as shown in FIG. 11 to produce an etch mask for defining the base and collector. The encapsulant is applied by spinning a suitable material such as benzocyclobutene at onto the surface to produce a 2 $\mu$m layer of polymer encapsulant, and curing the polymer by heating to 300° C. for 10 min.

Figure 12:
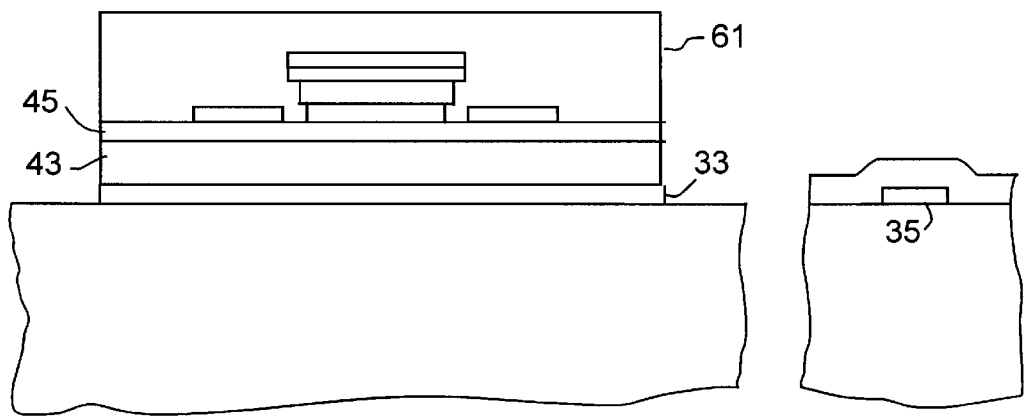

The lithographic mask used to define the etch mask 61 is aligned using the alignment marks 35. The exposed portions of the base layer 45 and collector layer 43 are sequentially ECR plasma etched using $BCl_3/N_2$. The structure resulting after this plasma etch is shown in FIG. 12. The precise alignment between the edge of the base and collector, and the edge of the previously formed sub-collector, as well as the precisely centered emitter and base contacts, are all achieved as the result of using alignment marks 35 formed in the subcollector layer at the step represented by FIG. 3.

The use of both wet and dry etching techniques may be used to advantage in this process. Plasma etching is convenient, and wet etching is rapid and more selective. Moreover, using a wet etch following a plasma etch tends to remove surface damage caused by plasma exposure. The plasma etch may be performed by ECR plasma processing in a Plasma-Therm SLR 770 system using room temperature, at a bias of −80V d.c., a $\mu$-wave power of 250 W, and a pressure of 2 mTorr. Flow rates in sccm are 12 $BCl_3+3\ N_2$. Plasma etch rates are about 150 Å/min for this etch chemistry. Selective wet etching may be performed at 4° C. with 1:1:15 $H_3PO_4$:$H_2O_2$:$H_2O$, for InGaAs and 1:1:1 HCl:$H_3PO_4$:$H_2O$, for InP. Etch rates are 1000 Å/min and 800 Å/min, respectively.

Figure 13:
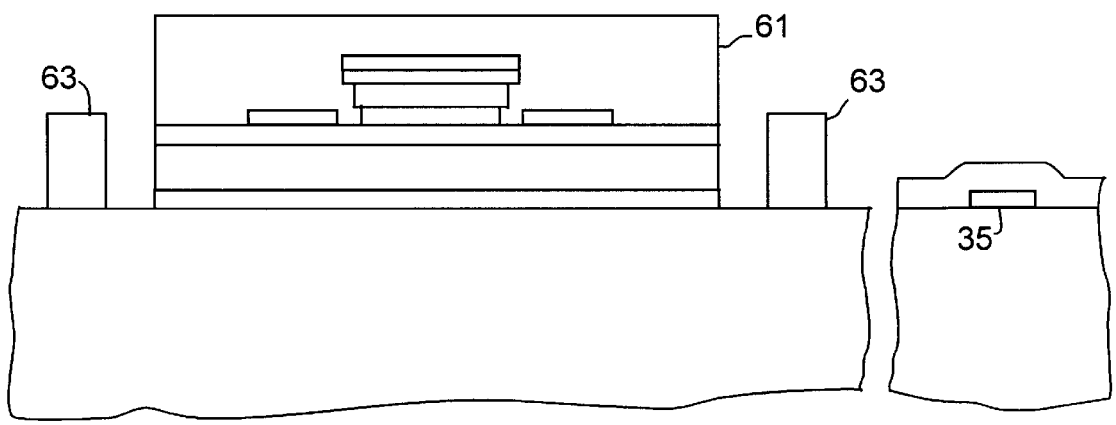

After etching the base and collector layers the substrate is accessible for the deposition of collector contacts 63 as shown in FIG. 13. Again, the alignment marks 35 are used for registering the photomask for defining the contacts. The collector contact may be Pd/Pt/Au. The finished structure is then passivated and encapsulated with a common layer, i.e. a polymer encapsulant.

Figure 14:
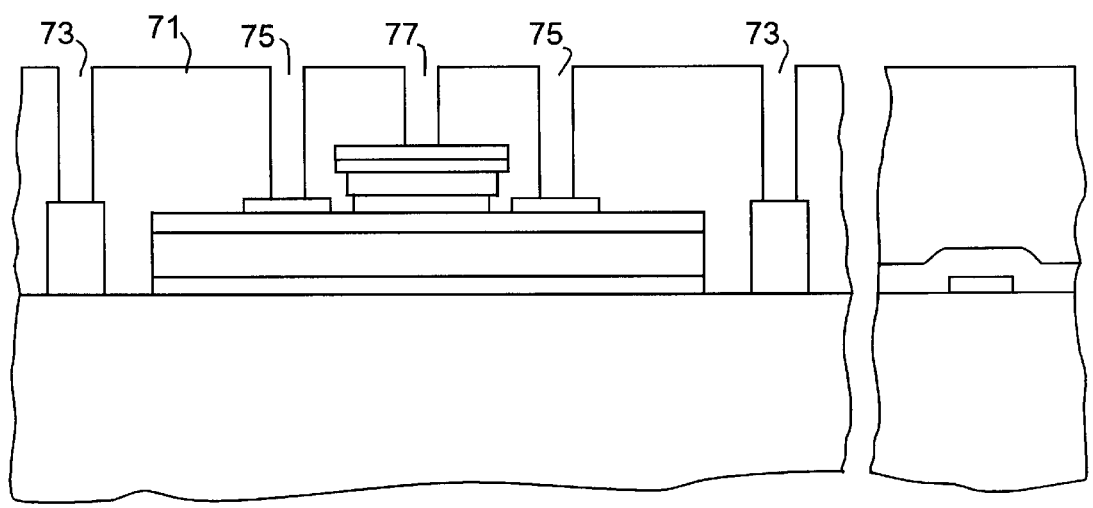
Figure 15:
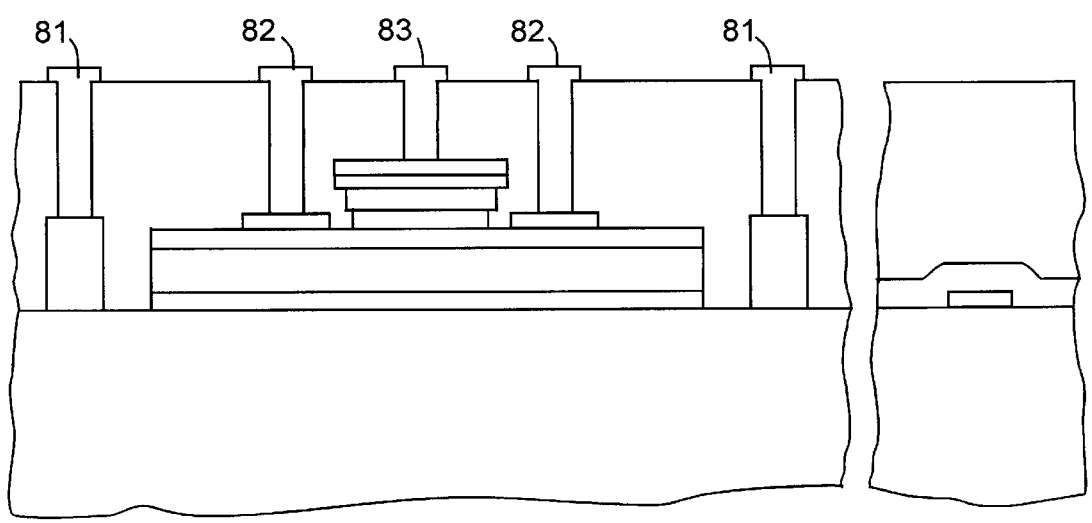

With reference to FIG. 14, the device structure is shown after completion of the encapsulant step, and after plasma etching of via holes 73, 75, and 77 through encapsulant layer 71 to the collector, base and emitter metallization respectively. Metal contacts 81–83 are evaporated into the via holes as shown in FIG. 15 to complete the device.

The alignment marks 35, formed early in this process sequence, were found to be robust enough to withstand the multiple processing steps required to fabricate this complex device structure. The alignment marks were used at critical process stages represented by FIGS. 7 and 11, i.e. to align the emitter to the sub-collector, and to align the base and collector to the sub-collector. The former alignment is important for device yield. The latter alignment addresses to main objective of the invention, reducing base-collector capacitance.

The metallization layers just described may be any suitable conductive material. In the technology described in detail here the base contact is Pd/Pt/Au and the metallization for interconnect levels is Ti/Au. The thickness of the layer is typically 1–2 $\mu$m.

The most common mask and etch operations in this device technology employ photolithography for making the mask, and photolithographic steppers as the exposure tool, usually at a wavelength in the deep UV. However, e-beam or x-ray lithographic techniques can also be used. Accordingly, reference may be made herein to lithography and lithographic steps, and that reference is intended to include these alternative techniques.

The HBT process described in detail above is given by way of example of a process in which a first device feature (in the HBT case the sub-collector) is formed in a first semiconductor layer, and that device feature is thereafter covered by growing at least one additional semiconductor layer, which layer is patterned using a lithographic alignment step. The lithographic alignment step will typically involve the step of covering the additional semiconductor layer with a photoresist layer, aligning a photomask to the photoresist layer using the alignment marks as alignment means, and exposing the photoresist layer to actinic radiation through the photomask.

Various additional modifications of this invention will occur to those skilled in the art. All deviations from the specific teachings of this specification that basically rely on the principles and their equivalents through which the art has been advanced are properly considered within the scope of the invention as to described and claimed.

We claim:

1. A process for the manufacture of semiconductor integrated circuit devices which includes at least one lithographic alignment the method comprising:
   a. forming a first semiconductor layer on said substrate,
   b. patterning said first semiconductor layer to form a first device feature,
   c. forming semiconductor alignment marks in said first semiconductor layer,
   d. selectively depositing a protective layer on said alignment marks,
   e. depositing a second semiconductor layer using a process whereby semiconductor material is deposited selectively on said first semiconductor layer while not depositing semiconductor material on said protective layer, and
   f. forming a lithographic mask on said second semiconductor layer using said alignment marks to register said lithographic mask.

2. The process of claim 1 wherein first semiconductor layer is a III-V semiconductor.

3. The process of claim 2 wherein the lithographic mask photolithographic mask.

4. The process of claim 1 wherein said protective layer is $SiO_2$.

5. The process. of claim 1 wherein said second semiconductor layer is a III-V semiconductor.

6. The process of claim 5 wherein said first and second semiconductor layers are grown using molecular beam epitaxy.

7. The process of claim 1 including the step of covering said second semiconductor layer with a photoresist layer, aligning a photomask to said photoresist layer using said alignment marks as alignment means, and exposing said photoresist layer to actinic radiation through said photomask.

8. A method for the manufacture of heterostructure transistors comprising:
   a. depositing a first III-V semiconductor layer on a semiconductor wafer, b. patterning said first III-V semiconductor layer to form at least one sub-collector region on said wafer, and a series of semiconductor alignment marks on said wafer, c. selectively depositing a protective layer on said alignment marks, d. depositing a III-V semiconductor collector layer using a process whereby semiconductor material is deposited selectively on said first semiconductor layer while not depositing semiconductor material on said protective layer bare, e. depositing a III-V semiconductor base layer using a process whereby semiconductor material is deposited selectively on said semiconductor collector layer while not depositing semiconductor material on said protective layer bare, f. depositing a III-V semiconductor emitter layer using a process whereby semiconductor material is deposited selectively on said semiconductor base layer while not depositing semiconductor material on said protective layer bare, g. depositing a III-V semiconductor emitter contact layer using a process whereby semiconductor material is deposited selectively on said semiconductor emitter layer while not depositing semiconductor material on said protective layer bare, h. forming a metal contact layer on said semiconductor emitter contact layer, i. forming a lithographic mask on said metal contact layer using said alignment marks to register said lithographic mask.

j. etching said metal contact layer to form a metal contact, k. etching said semiconductor emitter layer using said metal contact as a mask to form an emitter, l. forming base contacts to said semiconductor base layer, m. masking said semiconductor base layer using said alignment marks to register the mask so that the unmasked portion of said semiconductor base layer is aligned to the sub-collector region, n. etching the unmasked portion of said semiconductor base layer and an underlying portion of said semiconductor collector layer to form a base and a collector, and o. forming electrical contacts to said sub-collector region, said base and said collector.

9. The method of claim 8 wherein said wafer is InP.

10. The method of claim 9 wherein said III-V semiconductor layers are grown by MOMBE.

11. The method of claim 10 wherein said III-V semiconductor layers are grown by a method selected from the group consisting of MOMBE, CBE, MOCVD, and combinations thereof.

* * * * *